(12) United States Patent
Takeshita et al.

(10) Patent No.: US 10,879,184 B2
(45) Date of Patent: Dec. 29, 2020

(54) ELECTRONIC DEVICE MOUNTING BOARD, ELECTRONIC PACKAGE, AND ELECTRONIC MODULE

(71) Applicant: KYOCERA Corporation, Kyoto (JP)

(72) Inventors: Fumiaki Takeshita, Esslingen (DE); Teruaki Nonoyama, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/553,246

(22) Filed: Aug. 28, 2019

(65) Prior Publication Data

US 2020/0075495 A1   Mar. 5, 2020

(30) Foreign Application Priority Data

Aug. 30, 2018   (JP) ................................. 2018-161274

(51) Int. Cl.

| | |
|---|---|
| *H01L 23/495* | (2006.01) |
| *H01L 23/538* | (2006.01) |
| *H01L 23/15* | (2006.01) |
| *H01L 23/02* | (2006.01) |
| *H01L 23/00* | (2006.01) |
| *H01L 31/0203* | (2014.01) |
| *H01L 33/48* | (2010.01) |

(52) U.S. Cl.
CPC .......... *H01L 23/5386* (2013.01); *H01L 23/02* (2013.01); *H01L 23/15* (2013.01); *H01L 23/5384* (2013.01); *H01L 24/16* (2013.01); *H01L 24/48* (2013.01); *H01L 31/0203* (2013.01); *H01L 33/486* (2013.01); *H01L 2224/16225* (2013.01); *H01L 2224/48227* (2013.01)

(58) Field of Classification Search
CPC . H01L 23/15; H01L 23/5384; H01L 23/5386; H01L 24/16; H01L 24/48; H01L 33/486; H01L 2224/16225; H01L 2224/48227
See application file for complete search history.

(56) References Cited

U.S. PATENT DOCUMENTS

| | | | |
|---|---|---|---|
| 6,479,901 B1 | 11/2002 | Yamada | |
| 2006/0138436 A1* | 6/2006 | Chen | H01L 33/486 257/98 |
| 2009/0250809 A1* | 10/2009 | Yoshida | H01L 23/367 257/723 |
| 2012/0091562 A1* | 4/2012 | Roh | H01L 25/0657 257/618 |
| 2016/0240503 A1* | 8/2016 | Shu | H01L 23/49816 |

FOREIGN PATENT DOCUMENTS

JP    2000-188351 A    7/2000

* cited by examiner

*Primary Examiner* — Phuc T Dang
(74) *Attorney, Agent, or Firm* — Volpe Koenig

(57) ABSTRACT

In one aspect of this disclosure, an electronic device mounting board includes a substrate having a first surface and a second surface opposite to the first surface. The substrate has a first recess located on the first surface and a second recess located on the second surface. The substrate includes an electrode pad. The electrode pad is located in the first recess. The second recess in the substrate contains a reinforcement dividing the second recess into a plurality of recesses. The reinforcement is located separate from the electrode pad or is located to overlap the electrode pad in a plan view.

15 Claims, 12 Drawing Sheets

ELECTRONIC DEVICE MOUNTING BOARD, ELECTRONIC PACKAGE, AND ELECTRONIC MODULE

BACKGROUND

1. Technical Field

The present disclosure relates to an electronic device mounting board on which an electronic device or an integrated circuit is mountable, and to an electronic package and an electronic module. Examples of the electronic device include an imaging device including a charge-coupled device (CCD) or a complementary metal oxide semiconductor (CMOS) device, a light-emitting device including a light emitting diode (LED), a device for sensing pressure, air pressure, acceleration, and a gyro sensor.

2. Description of the Background

A known electronic device mounting board includes a wiring board including insulating layers. This electronic device mounting board may have electrode pads for mounting electronic devices on its front and back surfaces (refer to Japanese Unexamined Patent Publication JP-A 2000-188351).

BRIEF SUMMARY

A circuit board may typically have electrode pads on both upper and lower surfaces, on which electronic components or electronic devices are mounted. In the process of mounting electronic components or electronic devices, the upper and lower surfaces of the board may be fixed on a fixture or another tool. When the board is fixed on the fixture, the electrode pads on the two surfaces of the board may be damaged, possibly causing defective mounting of the electronic components or electronic devices.

A board with a recess for accommodating an electronic component or an electronic device may undergo the mounting process including pressurizing the board. The resultant pressure may cause deformation or cracks on the bottom surface of the recess. Such deformation or cracks on the bottom surface of the recess may cause defective mounting or disable mounting in the process of mounting the electronic device or electronic component.

An electronic device mounting board according to one aspect of the present disclosure includes a substrate having a first surface and a second surface opposite to the first surface, a first recess located on the first surface, a second recess located on the second surface, and an electrode pad located in the first recess. The second recess contains a reinforcement dividing the second recess into a plurality of recesses. The reinforcement is located separate from the electrode pad or is located to overlap the electrode pad in a plan view.

An electronic package according to another aspect of the present disclosure includes the electronic device mounting board, and an electronic device mounted on the electronic device mounting board.

An electronic module according to still another aspect of the present disclosure includes the electronic package, and a housing located above the electronic package.

DETAILED DESCRIPTION

Structures of Electronic Device Mounting Board and Electronic Package

Embodiments of the present disclosure will now be described by way of example with reference to the drawings. In the embodiments described below, an electronic package includes an electronic device mounted on an electronic device mounting board. An electronic module includes a housing or a member located on or above the upper surface of the electronic device mounting board or surrounding the electronic package. Although the electronic device mounting board, the electronic package, and the electronic module may have any of their faces being upward or downward, they are herein defined using the orthogonal xyz coordinate system with the positive z-direction being upward for ease of explanation.

First Embodiment

Figure 1A:
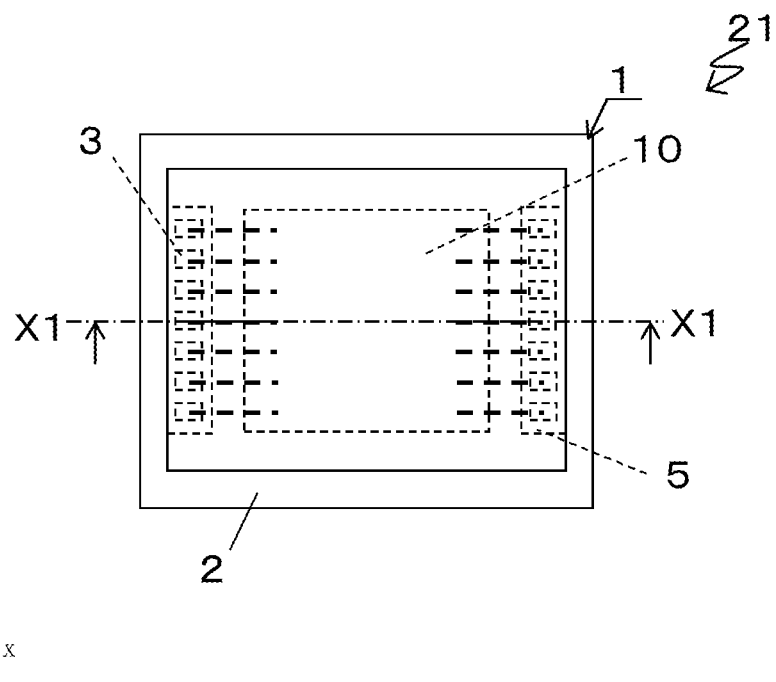
FIG. 1A is an external top view of an electronic device mounting board and an electronic package according to a first embodiment of the present disclosure.
Figure 1B:
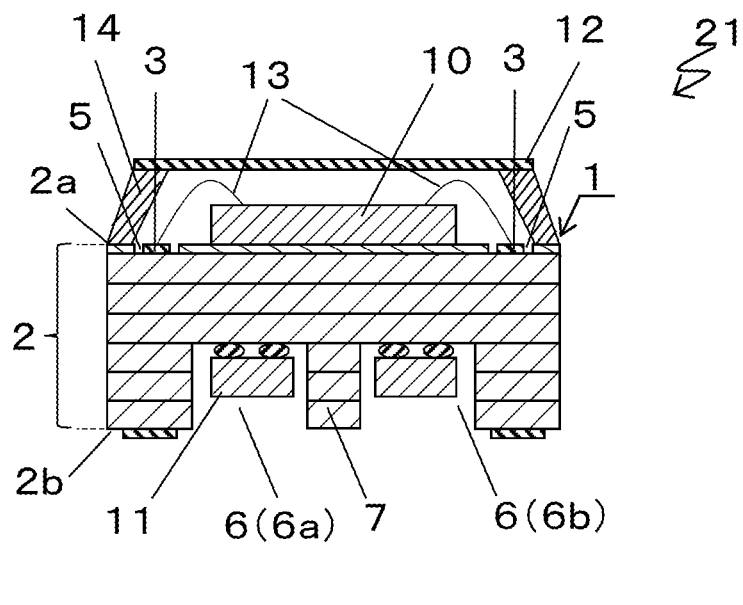
FIG. 1B is a cross-sectional view taken along line X1-X1 in FIG. 1A.
Figure 2A:
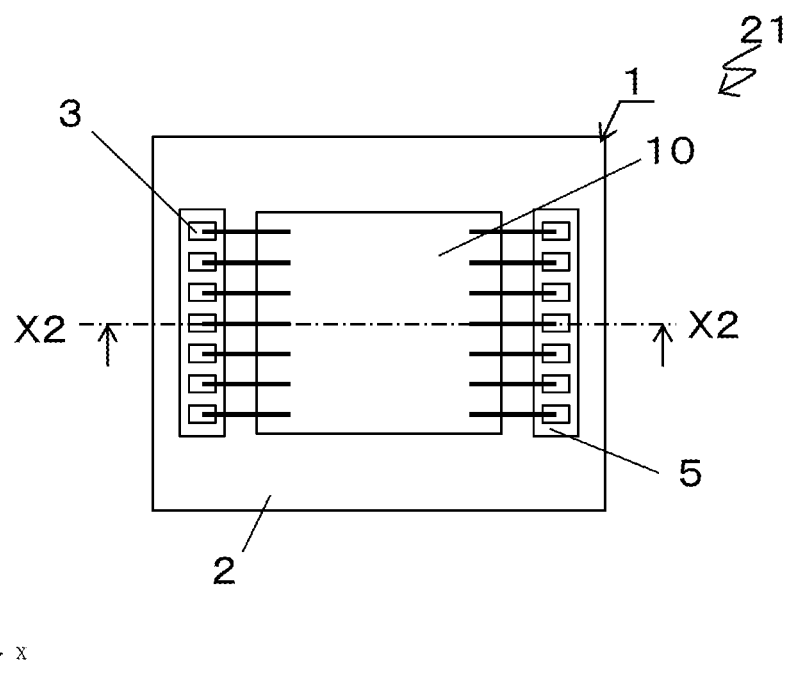
FIG. 2A is an external top view of an electronic device mounting board and an electronic package according to a modification of the first embodiment of the present disclosure without showing a lid.
Figure 2B:
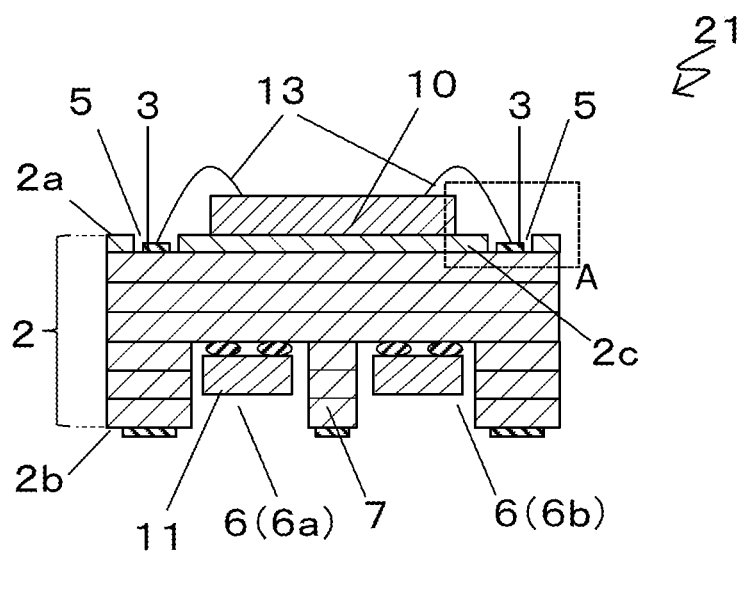
FIG. 2B is a cross-sectional view taken along line X2-X2 in FIG. 2A.
Figure 3A:
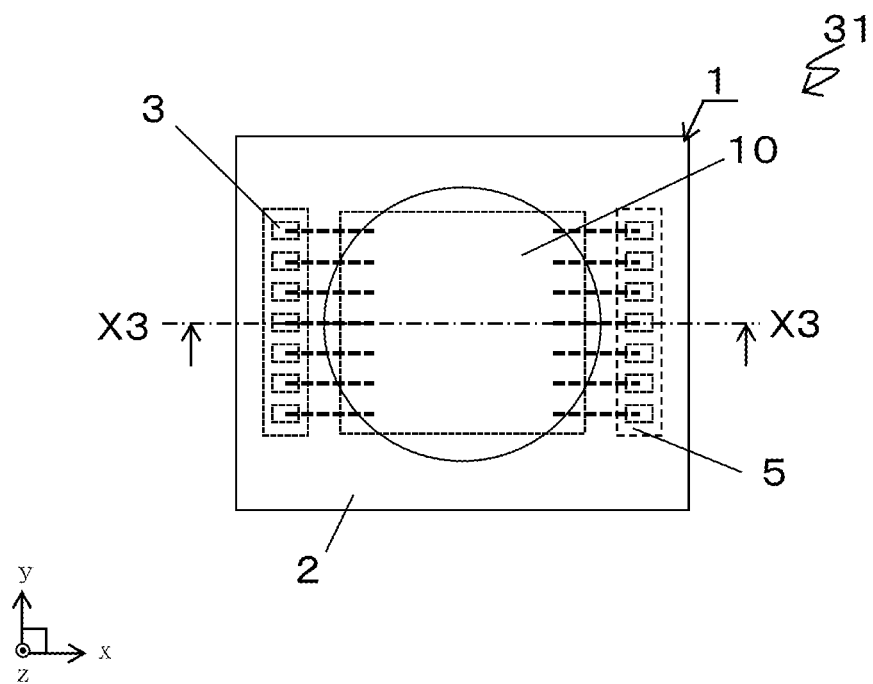
FIG. 3A is an external top view of an electronic module according to the first embodiment of the present disclosure.
Figure 3B:
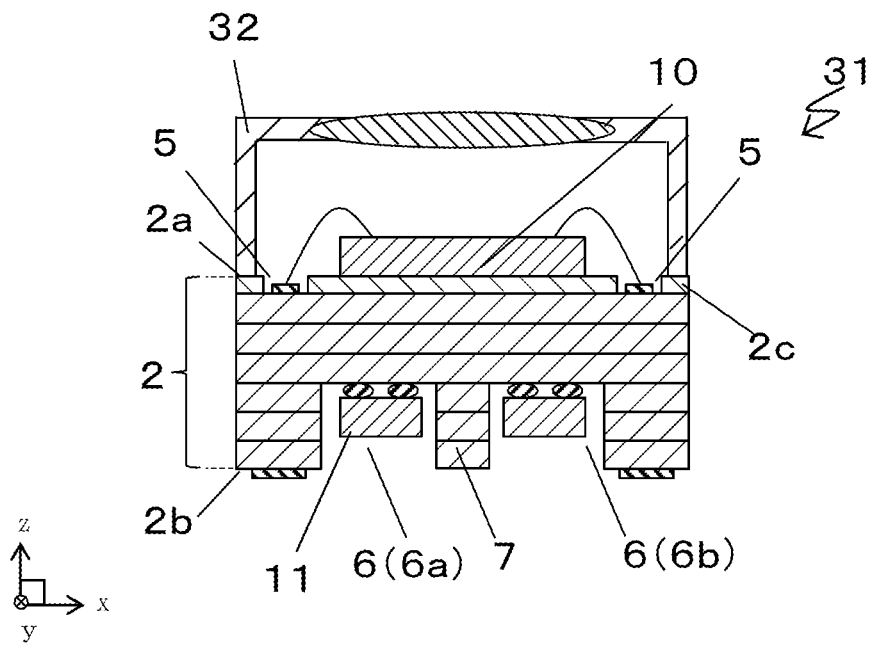
FIG. 3B is a cross-sectional view taken along line X3-X3 in FIG. 3A.

An electronic device mounting board 1 according to a first embodiment of the present disclosure, and an electronic module 31 and an electronic package 21 each including the electronic device mounting board 1 will now be described with reference to FIGS. 1A to 7B. In the present embodiment, FIGS. 1A and 1B show the electronic package 21, and FIGS. 2A and 2B show the electronic package 21 without a lid 12. FIGS. 3A and 3B show the electronic module 31. FIGS. 4A to 5B are bottom views of the electronic device mounting board 1. FIGS. 6A to 7B are cross-sectional views of the electronic device mounting board 1 showing its main part A in an enlarged manner.

The electronic device mounting board 1 includes a substrate 2 having a first surface 2a and a second surface 2b opposite to the first surface 2a. The substrate 2 has a first recess 5 on the first surface 2a and a second recess 6 on the second surface 2b. The substrate 2 includes electrode pads 3. The electrode pads 3 are located in the first recess 5. The second recess 6 on the substrate 2 contains a reinforcement 7 that is located separate from the electrode pads 3 and divides the second recess 6 into a plurality of recesses.

The electronic device mounting board 1 includes a substrate 2 having a first surface 2a and a second surface 2b opposite to the first surface 2a. In the example shown in FIG. 1B, the first surface 2a is the uppermost surface of the substrate 2 and the second surface 2b is the lowermost surface of the substrate. Another insulating layer in the shape of a frame for example may be located on the first surface 2a and/or the second surface 2b. In other words, the first surface 2a and/or the second surface 2b may define the bottom surface of the recess together with such another frame-shaped insulating layer. In this case, the frame-shaped insulating layer may be defined the side walls of the recess as described later.

The first surface 2a and/or the second surface 2b may have a mount area on which an electronic device 10 is mountable. The mount area may receive at least one electronic device 10, and may be appropriately defined as an area inward from the outermost peripheries of the electrode pads 3 (described later) or as an area used for attaching the lid 12 or a larger area. The mount area may receive components other than the electronic device 10. The mount area may receive, for example, an electronic component described later, and may receive any number of electronic devices 10 and/or electronic components 23.

Although the substrate 2 includes multiple insulating layers in the example shown in FIGS. 1A to 2B, the substrate 2 may be a single layer, such as a molded layer or a layer pressed with a die. The insulating layers to be the substrate 2 are formed from, for example, an electrical insulating ceramic material or a resin.

Examples of the electrical insulating ceramic material used for the insulating layers forming the substrate 2 include sintered aluminum oxide, sintered mullite, sintered silicon carbide, sintered aluminum nitride, sintered silicon nitride, and sintered glass ceramic. Examples of the resin used for the insulating layers forming the substrate 2 include a thermoplastic resin, an epoxy resin, a polyimide resin, an acryl resin, a phenolic resin, and a fluorine-based resin. Examples of the fluorine-based resin include a polytetrafluoroethylene resin.

The substrate 2 may include six insulating layers as shown in FIG. 1B, or may include five or less, or seven or more insulating layers. The use of five or less layers reduces the thickness of the electronic device mounting board 1. The use of seven or more layers increases the rigidity of the electronic device mounting board 1. The insulating layers may have openings with different sizes. The openings may define a step, on which electrodes other than the electrode pads 3 may be placed.

The electronic device mounting board 1 has an outermost perimeter with a length of, for example, 0.3 mm to 10 cm on one side, and may be rectangular or square when it is quadrangular in a plan view. The electronic device mounting board 1 has a thickness of, for example, at least 0.2 mm.

The substrate 2 in the electronic device mounting board 1 has a first recess 5 on the first surface 2a and a second recess 6 on the second surface 2b. The second recess 6 may accommodate a semiconductor device 11 or another semiconductor device placed inside, and may be high enough to accommodate such components in a cross-sectional view. The semiconductor device 11 may be a semiconductor device or an electronic device, or may be an electronic component. The first recess 5 may be deep enough to accommodate at least the electrode pads 3 in the height direction in a cross-sectional view. The depth of the first recess 5 may be substantially the same as the height of each electrode pad 3, or may be substantially the same as or larger than the height of an electronic component that may be mounted on the electrode pads 3. The first recess 5 and the second recess 6 may have the same depth or different depths in a cross-sectional view.

The electronic device mounting board 1 includes the electrode pads 3 on the substrate 2. The electrode pads 3 are electrically connected to, for example, the electronic device 10 and/or the electronic component.

The electronic device mounting board 1 may include electrodes for connection to external circuits on the upper surface, side surfaces, or lower surface of the substrate 2. The electrodes for connection to external circuits may electrically connect the substrate 2 or the electronic package 21 to external circuit boards.

In addition to the electrode pads 3 and/or the electrodes for connection to external circuits, the substrate 2 may also include electrodes between the insulating layers, inner wire conductors, and feedthrough conductors that vertically connect the inner wire conductors on its upper surface or lower surface. The electrodes, inner wire conductors, or feedthrough conductors may be uncovered on the surface of the substrate 2. The electrodes, inner wire conductors, or the feedthrough conductors may electrically connect the electrode pads 3 and/or the electrodes for connection to external circuits.

When the multiple insulating layers are formed from an electrical insulating ceramic material, the electrode pads 3, the electrodes for connection to external circuits, the electrodes, the inner wire conductors, and/or the feedthrough conductors are formed from tungsten (W), molybdenum (Mo), manganese (Mn), palladium (Pd), silver (Ag), or copper (Cu), or an alloy containing one or more of these metals. The electrical insulating ceramic material may contain copper (Cu) alone. When the multiple insulating layers are formed from a resin, the electrode pads 3, the electrodes for connection to external circuits, the inner wire conductors, and/or the feedthrough conductors may be formed from copper (Cu), gold (Au), aluminum (Al), nickel (Ni), molybdenum (Mo), palladium (Pd), or titanium (Ti), or an alloy containing one or more of these metals.

The uncovered surfaces of the electrode pads 3, the electrodes for connection to external circuits, the electrodes, the inner wire conductors, and/or the feedthrough conductors may further be plated. The plating layer protects the surfaces of the electrodes for connection to external circuits, conductor layers, and the feedthrough conductors against oxidation. The plating layer also improves the electrical connection between the electrode pads 3 and the electronic device 10 with a first connection member 13, such as wire bonding. The plating layer may be, for example, a Ni plating layer with a thickness of 0.5 to 10 μm, and the Ni plating layer may further be coated with a gold (Au) plating layer with a thickness of 0.5 to 3 μm.

The electrode pads 3 are located in the first recess 5 in the electronic device mounting board 1. A board may typically have electrode pads on both upper and lower surfaces, on which electronic components or electronic devices are mounted. In the process of mounting electronic components or electronic devices, the upper and lower surfaces of the board may be fixed on a fixture or another tool. When the board is fixed on the fixture, the electrode pads on the two surfaces of the board may be damaged, possibly causing defective mounting of the electronic components or the electronic devices.

In the present embodiment, the electrode pads 3 are located in the first recess 5, and thus are less likely to come in contact with the fixture. This structure reduces damage on the electrode pads 3, and thus reduces defective mounting of the electronic device 10 or the electronic component on the electrode pads 3.

The substrate 2 included in the electronic device mounting board 1 has, in the second recess 6, the reinforcement 7 that is located separate from the electrode pads 3 and divides the second recess 6 into a plurality of recesses.

The electronic device mounting boards have recently been thinner in response to a demand. The electronic device mounting boards having a recess for accommodating an electronic component or an electronic device may receive another electronic component on the surface opposite to the recess. The electronic component may be fixed on the board at a location separate from the electrode pads using a die bonding material. The process of fixing the electronic component by pressurizing may cause deformation or cracks on the bottom surface of the recess due to the resultant pressure. Such deformation or cracks on the bottom surface of the recess may cause defective mounting or disable mounting in the process of mounting the electronic device or the electronic component.

In the present embodiment, the second recess 6 contains the reinforcement 7 that divides the second recess 6 into a plurality of recesses, and thus reduces deformation of the bottom surface of the second recess 6. This structure thus reduces cracks. The reinforcement 7 is located separate from the electrode pads 3 as viewed from above. The reinforcement 7 may be located around the part that receives pressure in the process of fixing the electronic device 10 or the electronic component to the surface (first surface 2a) opposite to the second recess 6 and separate from the electrode pads 3 using a die bonding material. This structure lowers the likelihood of mounting being either defective or disabled in the process of mounting the electronic device 10 or the electronic component.

For example, the second recess 6 may accommodate multiple semiconductor devices 11 for processing signals from the electronic device 10. In this case, the second recess 6 may have a larger area as viewed from above. This may cause deformation of the board in the process of producing the electronic device mounting board 1. The bottom surface of the second recess 6 may deform and cause cracks or breaks in the substrate 2 in the process of mounting the electronic device 10 or the semiconductor device 11.

In the present embodiment, the reinforcement 7 in the second recess 6 supports the bottom surface of the second recess 6. This structure reduces deformation of the board in the process of producing the electronic device mounting board 1, or deformation of the bottom surface of the second recess 6 in the process of mounting the electronic device 10 or the semiconductor device 11 when the larger second recess 6 accommodates the multiple semiconductor devices 11. This structure thus reduces cracks or breaks in the substrate 2.

The above structure reduces damage on the electrode pads 3, and improves the mountability of the electronic device 10 and/or the electronic component on the first surface 2a and the second surface 2b of the electronic device mounting board 1.

The reinforcement 7 is at any location separate from the electrode pads 3 as viewed from above. For example, the electrode pads 3 may or may not overlap the second recess 6 as viewed from above to produce the advantageous effects of the present embodiment.

The reinforcement 7 and the substrate 2 may be formed from the same material or different materials. The reinforcement 7 and the substrate 2 formed from the same material may be integrated together to improve the bonding strength. The reinforcement 7 and the substrate 2 formed from different materials may be bonded using a bond or another material. In this case, the reinforcement 7 may be easily located separate from the side surfaces of the second recess 6.

The height of the reinforcement 7 in a cross-sectional view is substantially the same as the height of the side wall of the second recess 6 in a cross-sectional view. The reinforcement 7 and the substrate 2 formed from different materials may have the height in a cross-sectional view reflecting the height of the bond for bonding the reinforcement 7 and the substrate 2 in a cross-sectional view. In other words, the sum of the height of the reinforcement 7 and the bond for the reinforcement 7 in a cross-sectional view may be substantially the same as the height of the side wall of the second recess 6 in a cross-sectional view.

Figure 4A:
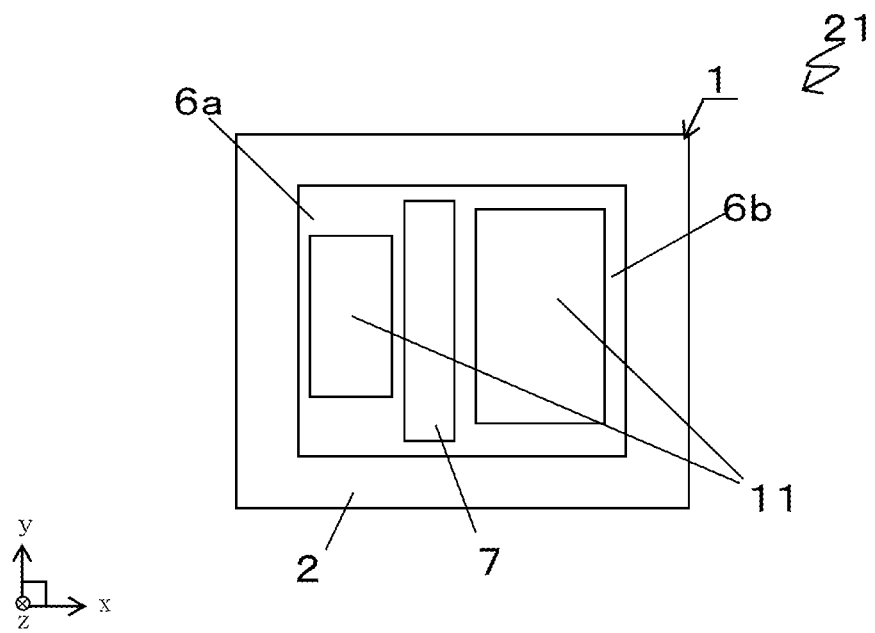
FIGS. 4A and 4B are external bottom views of electronic device mounting boards and electronic packages according to other modifications of the first embodiment of the present disclosure.
Figure 4B:
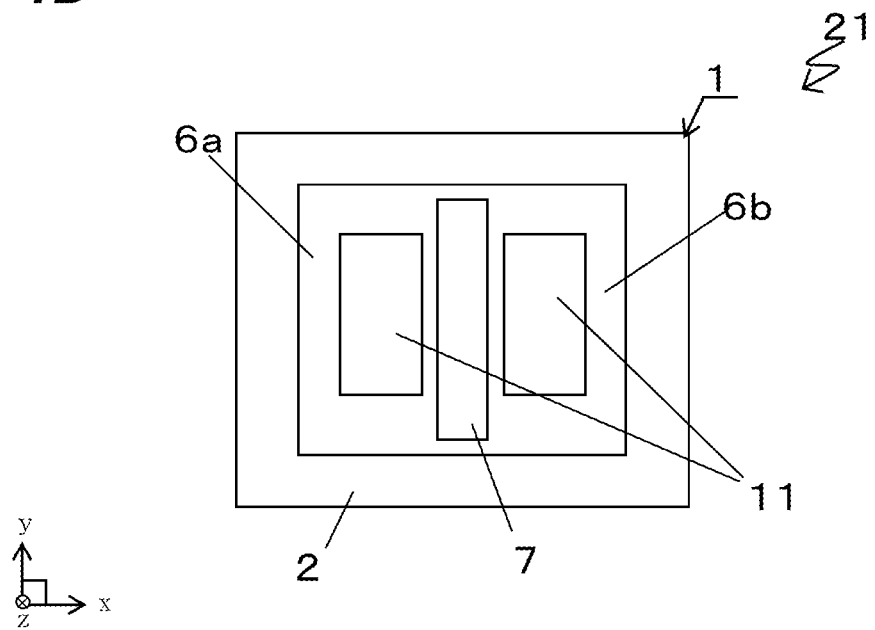
Figure 5A:
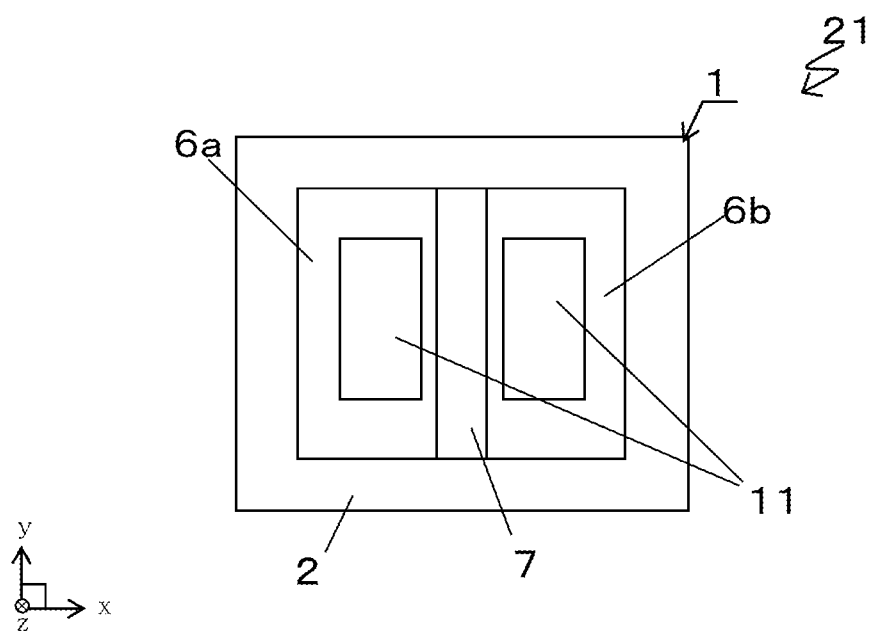
FIGS. 5A and 5B are external bottom views of electronic device mounting boards and electronic packages according to other modifications of the first embodiment of the present disclosure.
Figure 5B:
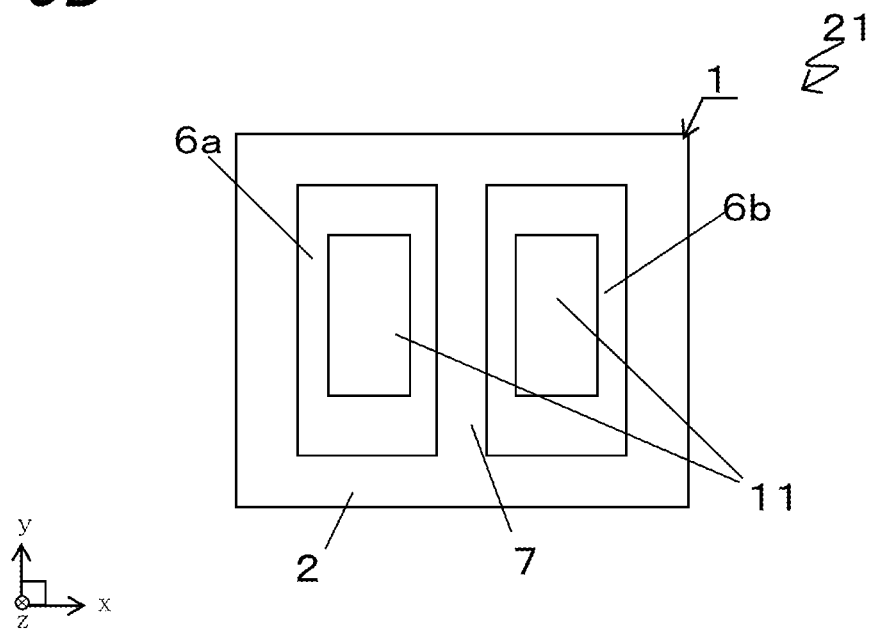

FIGS. 4A to 5B are bottom views of the electronic device mounting board 1 according to modifications of the present embodiment. In the modification as shown in FIGS. 4A and 4B, the reinforcement 7 may be located inside the second recess 6. Specifically, the reinforcement 7 may divide the second recess 6 into two recess (a third recess 6a and a fourth recess 6b) which are partially connected each other. In the modification as shown in FIGS. 5A and 5B, the reinforcement 7 may divide the second recess 6 so that the second recess 6 includes a third recess 6a and a fourth recess 6b which are adjacent to each other with the reinforcement 7 between them. In this case, the third recess 6a and the fourth recess 6b is separated from each other. In both modifications, the reinforcement 7 divides the second recess 6 into a plurality of recesses (into the third recess 6a and the fourth recess 6b). In other words, the reinforcement 7 forms a boundary between the third recess 6a and the fourth recess 6b in the second recess 6.

As shown in FIG. 4A, the reinforcement 7 may deviate from the center of the second recess 6 in a plan view. In this case, the second recess 6 may accommodate semiconductor devices 11 with different sizes, allowing more efficient use of the second recess 6 area and downsizing the electronic package. When the electronic device 10 is fixed with the die bonding material, deformation or cracks occur on the bottom surface of the second recess 6 at locations varying depending on the location of the die bonding material or the location of pressure applied to the electronic device 10. The reinforcement 7 may thus be located in a part that receives large pressure from the electronic device 10 as viewed from above to reduce deformation or cracks on the bottom surface of the second recess 6. This structure lowers the likelihood of mounting being either defective or disabled in the process of mounting the electronic device or the electronic component.

As shown in FIG. 4B, the reinforcement 7 may be located at around the center of the second recess 6 in a plan view. In other words, the third recess 6a and the fourth recess 6b may have the same size in a plan view. Typically, the bottom surface of the second recess 6 is most likely to have deformation or cracks at around the center of the bottom surface in a plan view. The reinforcement 7 is thus located at around the center of the second recess 6 in a plan view in the example shown in FIG. 4B to reduce deformation or cracks on the bottom surface of the second recess 6. This structure lowers the likelihood of mounting being either defective or disabled in the process of mounting the electronic device or the electronic component.

The reinforcement 7 may be separate from the substrate 2 as shown in FIG. 5A, or may be integral with the substrate as shown in FIG. 5B. Either structure produces the advantageous effects of the present embodiment. The reinforcement 7 integral with the substrate 2 shown in FIG. 5B lowers the likelihood of coming off the substrate 2 and failing to produce the advantageous effects of the present embodiment. This structure lowers the likelihood of mounting being either defective or disabled in the process of mounting the electronic device or the electronic component.

The electronic device mounting board 1 in the example shown in FIGS. 1A to 2B includes a plurality of first recesses 5. Although two first recesses 5 are shown in FIGS. 1A to 2B, the electronic device mounting board 1 may include three or more first recesses 5. The multiple first recesses 5 can accommodate the electrode pads 3 for connection to the electronic device 10 and/or to the electronic component at multiple different positions. This structure produces the advantageous effects of the present embodiment and allows the electronic device 10 to have more terminals. The electronic package 21 can thus have high functionality. This structure also increases the areas in which the electronic component is mountable, and extends the functionality of the electronic package 21.

As shown in FIGS. 1A to 3B, the first recess 5 may be less deep than the second recess 6. In this case as well, the first recess 5 that is deep enough to accommodate the electrode pads 3 as described above can still produce the advantageous effects of the present embodiment.

The electrode pads 3 having the upper surfaces located lower than the upper end of the first recess 5 (toward the lower surface or the second surface) are less likely to come in contact with the fixture or another tool. This structure reduces damage on the electrode pads 3 further. The first recess 5 having a depth greater than the thickness of the electrode pads 3 accommodates variations in the thickness direction of the electrode pads 3 in the process of preparing the first recess 5 and the electrode pads 3. This structure also lowers the likelihood that the electrode pads 3 come in contact with the fixture or another tool.

FIGS. 6A to 7B are enlarged cross-sectional views according to modifications of the present embodiment showing the main part A.

Figure 6A:
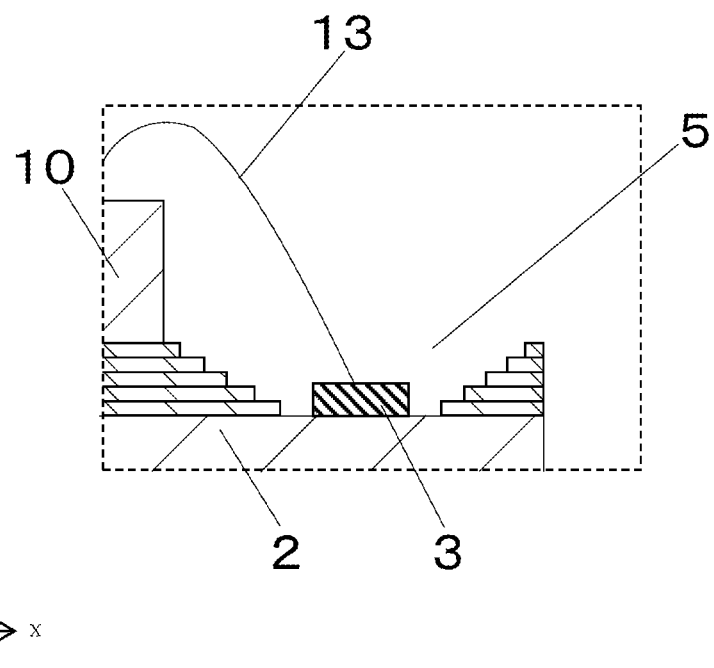
FIGS. 6A and 6B are enlarged cross-sectional views of electronic device mounting boards and electronic packages according to other modifications of the first embodiment of the present disclosure showing the appearance of the main part A.
Figure 6B:
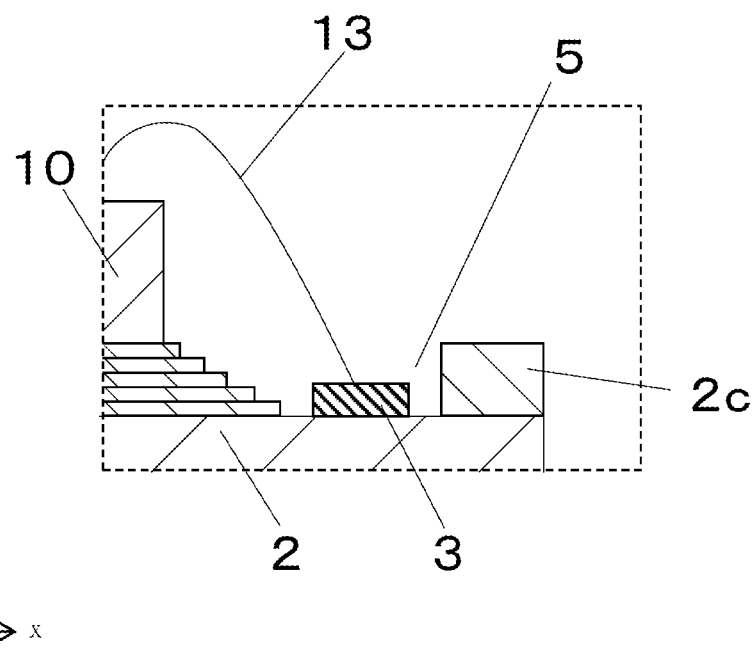

As shown in FIGS. 6A and 6B, the substrate 2 contains a ceramic material, and the first recess 5 may have the side walls with a ceramic coating. The first recess 5 having the side walls with a ceramic coating eliminates the stacking process or reduces the pressure for stacking as compared with the first recess 5 having the side walls formed from an insulating layer 2c. This structure reduces warpage in the substrate 2 in the process of preparing the substrate 2.

The first recess 5 having the side walls with a ceramic coating may overlap the second recess 6 in a plan view. However, the electrode pads 3 in the first recess 5 are located separate from the second recess 6 in a plan view. This structure lowers the likelihood that the electrode pads 3 (portions connected with the first connection members 13) and the second recess 6 overlap as viewed from above. The part that receives most pressure when the first connection member 13 is connected to the electrode pad 3 is less likely to have the smallest thickness. The substrate 2 is thus less likely to deform greatly. Accordingly, this structure reduces cracks or breaks in the substrate 2.

The first recess 5 having the side walls with a ceramic coating has, at the highest position, a height greater than the thickness of the electrode pads 3, thus reducing damage on the electrode pads 3. The above structure reduces damage on the electrode pads 3, and improves the mountability of the electronic device 10 and/or the electronic component and the semiconductor device 11 on the first surface 2a and the second surface 2b of the electronic device mounting board 1, while reducing cracks or breaks in the substrate 2.

The first recess 5 having the side walls with a ceramic coating may include either a single thick ceramic coating or multiple ceramic coatings to have a ceramic coating with a predetermined thickness (thicker than the electrode pad 3). The first recess 5 having the side walls with a single thick ceramic coating involves a single application of a ceramic coating, thus reducing the number of processes. The first recess 5 having the side walls with multiple ceramic coatings undergoes the application of a ceramic coating multiple times to reliably achieve the predetermined thickness.

The first recess 5 having the side walls may be formed through the application of a ceramic coating multiple times to have the opening that becomes wider away from the first surface 2a. In other words, the first recess 5 with a ceramic coating may be stepped in a cross-sectional view. This structure lowers the likelihood that the ceramic coating may be erroneously applied to a portion to be the first recess 5 in the process of applying a ceramic coating multiple times and fails to have a predetermined space in the first recess 5, or lowers the likelihood that the ceramic coating adheres to the surface of the electrode pads 3. The above structure also lowers the likelihood that the first connection member 13 as the wire bonding pad has a distal end erroneously in contact with a side wall of the first recess 5 and fails to connect to the electrode pads 3 at a predetermined position, or lowers the likelihood that the bonding strength is lowered in the process of connecting the first connection member 13 to the electrode pads 3. This improves the mountability of the electronic device 10 on the electronic device mounting board 1.

The first recess 5 including ceramic coatings on the side walls may be prepared in a manner other than the manufacturing method according to the first embodiment. For example, an insulating paste to be a ceramic coating may be applied to a predetermined portion by, for example, screen printing and fired before and after applying a wiring paste to be the electrode pads 3. The insulating paste may then be pressurized from above to improve the bonding strength between the substrate 2 and the ceramic coating.

Figure 7A:
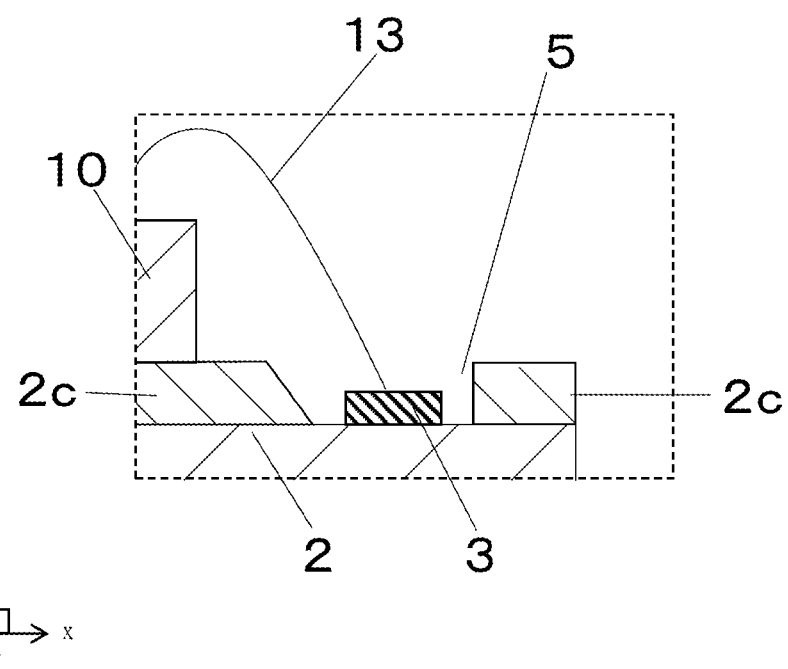
FIGS. 7A and 7B are enlarged cross-sectional views of electronic device mounting boards and electronic packages according to other modifications of the first embodiment of the present disclosure showing the appearance of the main part A.
Figure 7B:
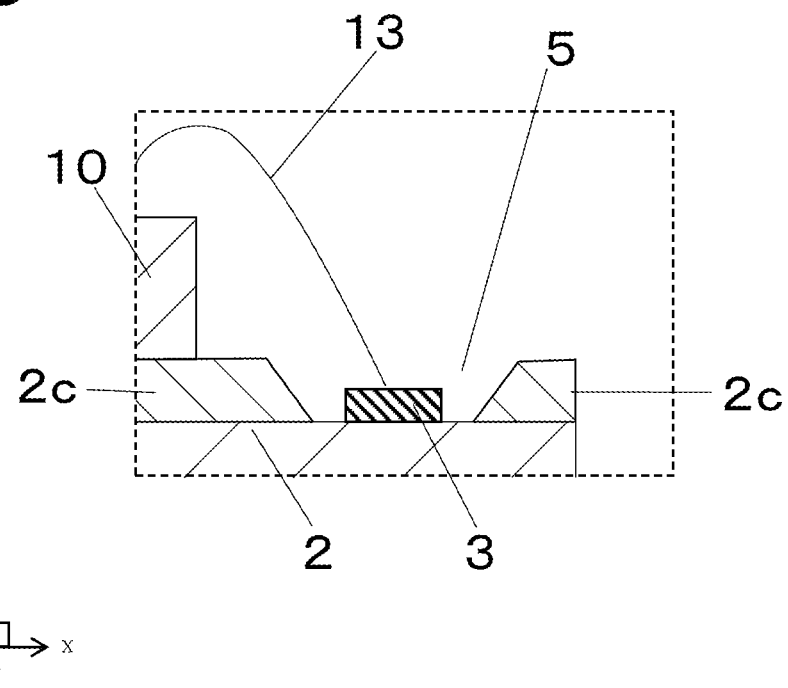

As shown in FIGS. 7A and 7B, the first recess 5 may have the side walls formed from the insulating layer 2c. The first recess 5 having the side walls formed from the insulating layer 2c can be deep. This structure reduces damage on the electrode pads 3 further.

The insulating layer 2c defining the first recess 5 may include the same material as or a different material from other insulating layers used in the substrate 2. The insulating layer 2c may further be sintered with the other insulating layers in the substrate 2. In this case, the insulating layer 2c may be less likely to come off the other insulating layers in the substrate 2. This structure reduces damage on the electrode pads 3 resulting from the coming off the insulating layer 2c.

As shown in FIG. 7B, one or more sides of the first recess 5 in the substrate 2 in a cross-sectional view may be tapered, or all the sides of the first recess 5 in a cross-sectional view may be tapered. Any of these modifications produce the advantageous effects of the embodiments of the present disclosure described above. The tapered first recess 5 with an opening wider toward the upper surface in a cross-sectional view also lowers the likelihood that the first connection member 13 as the wire bonding pad has a distal end erroneously in contact with a side wall of the first recess 5 and fails to connect to the electrode pads 3 at a predetermined position, or lowers the likelihood that the bonding strength is lowered in the process of connecting the first connection member 13 to the electrode pads 3. This improves the mountability of the electronic device 10 on the electronic device mounting board 1. The tapered first recess 5 with an opening narrower toward the upper surface in a cross-sectional view lowers the likelihood that a sealing resin, which is filled in the recess to reinforce the bonding strength after connecting the first connection member 13, flows onto the surface of the substrate 2. The tapered first recess 5 in a cross-sectional view also lowers the likelihood that, for example, solder used to mount the electronic component onto the electrode pads 3 flows onto the surface of the substrate 2.

As shown in FIG. 6A, the first recess 5 in the electronic device mounting board 1 may be stepped in a cross-sectional view. This structure lowers the likelihood that the first recess 5 fails to have a predetermined space through, for example, the application of an insulating layer 2c multiple times or stacking an insulating layer 2c multiple times due to process errors. The above structure also lowers the likelihood that the first connection member 13 as the wire bonding has a distal end erroneously in contact with a side wall of the first recess 5 and fails to connect to the electrode pads 3 at a predetermined position, or lowers the likelihood that the bonding strength is lowered in the process of connecting the first connection member 13 to the electrode pads 3. This improves the mountability of the electronic device 10 on the electronic device mounting board 1.

Electronic Package Structure

FIGS. 1A to 2B show an example of the electronic package 21. The electronic package 21 includes the electronic device mounting board 1 and the electronic device 10 mounted on the upper or lower surface of the electronic device mounting board 1.

The electronic package 21 includes the electronic device mounting board 1 and the electronic device 10 mounted on the electronic device mounting board 1. Examples of the electronic device 10 include an imaging device such as a charge-coupled device (CCD) or a complementary metal oxide semiconductor (CMOS) device, a light-emitting device such as a light emitting diode (LED), a device for sensing pressure, air pressure, acceleration, or a gyro sensor, and an integrated circuit. Examples of the electronic component include a passive component such as a chip capacitor, a resistor, or an inductor. The electronic device 10 may be mounted on the upper surface of the substrate 2 with an adhesive. The adhesive is, for example, silver epoxy or a thermosetting resin.

The electronic device 10 may be bonded to the electronic device mounting board 1 with the first connection member 13 including, for example, wire bonding, solder balls, and gold bumps.

The electronic package 21 may include a lid 12 that covers the electronic device 10 and is bonded to the upper surface of the electronic device mounting board 1. In this structure, the electronic device mounting board 1 may have the lid 12 connected to the upper surface of a frame portion in the substrate 2, or include a frame that supports the lid 12 and surrounds the electronic device 10 on the upper surface of the substrate 2. The frame may be formed from the same material as or a different material from the substrate 2.

When the frame and the substrate 2 are formed from the same material, they may be formed integrally with the uppermost insulating layer by, for example, forming the frame opening in the substrate 2. In another embodiment, the frame and the substrate 2 may be bonded together with a separately prepared brazing material.

When the substrate 2 and the frame are formed from different materials, the frame may be formed from, for example, the same material as the material for a lid bond 14 for bonding the lid 12 to the substrate 2. In this case, the lid bond 14 is thick enough to function both as a bonding member and the frame (as the support for the lid 12). Examples of the lid bond 14 include a thermosetting resin and a brazing material formed from glass with a low melting point or a metal component. The frame and the lid 12 may be formed from the same material. In this case, the frame and the lid 12 may be formed as one piece.

The lid 12 is formed from, for example, a highly transparent material such as a glass material for, for example, an imaging device used as the electronic device 10, such as a CMOS or CCD, or a light-emitting device, such as an LED. The lid 12 may be formed from a metallic material, a ceramic material, or an organic material when, for example, the electronic device 10 is an integrated circuit.

The lid 12 is bonded to the electronic device mounting board 1 with the lid bond 14. Examples of the material for the lid bond 14 include a thermosetting resin and a brazing material formed from glass with a low melting point or a metal component.

The electronic package 21 may receive the semiconductor device 11 located in the second recess 6 on the second surface 2b. Examples of the semiconductor device 11 include an imaging device such as a CCD or a CMOS device, a light-emitting device such as an LED, a device for sensing pressure, air pressure, acceleration, or a gyro sensor, an integrated circuit, and a memory. The semiconductor device 11 may be mounted on the second surface 2b of the substrate 2 with an adhesive. The adhesive is, for example, silver epoxy or a thermosetting resin.

The semiconductor device 11 may be bonded to the electronic device mounting board 1 with a second connection member 15 including, for example, wire bonding, solder balls, and gold bumps for connecting the semiconductor device.

The electronic package 21 may include a lid that covers the semiconductor device 11 and is bonded to the lower surface (second surface 2b) of the electronic device mounting board 1. The lid may be replaced with, for example, an external circuit.

The electronic package 21 includes the electronic device mounting board 1 shown in FIGS. 1A to 2B, and thus improves the mountability of the electronic device 10. This structure reduces deformation or cracks on the bottom surface of the second recess 6 in the electronic device mounting board 1 in the process of producing the electronic package 21. This structure thus lowers the likelihood that the electronic device 10 may malfunction under heat generated during operation.

Structure of Electronic Module

FIGS. 3A and 3B show an example of the electronic module 31 including the electronic device mounting board 1. The electronic module 31 includes the electronic package 21 and a housing 32 for covering the upper surface of the electronic package 21 or for covering the electronic package 21. In the example described below, the electronic module 31 is, for example, an imaging module.

The electronic module 31 may include the housing 32 (lens holder). The housing 32 improves hermetical sealing and reduces external stress directly applied to the electronic package 21. The housing 32 is formed from, for example, a resin or a metal material. The lens holder as the housing 32 may incorporate one or more lenses formed from, for example, a resin, a liquid, glass, or quartz. The housing 32 may include, for example, a drive for vertical or horizontal driving, and may be electrically connected to, for example, the pads on the surface of the electronic device mounting board 1 with a bond such as solder.

The housing 32 may have an opening in at least one of the four sides as viewed from above. Through the opening in the housing 32, an external circuit board may be placed for electrical connection to the electronic device mounting board 1. After the external circuit board is electrically connected to the electronic device mounting board 1, the opening in the housing 32 may be sealed with a sealant, such as a resin, to fill a gap at the opening and hermetically seal the inside of the electronic module 31.

The electronic module 31 includes the electronic device mounting board 1 shown in FIGS. 3A and 3B, and thus improves the mountability of the electronic device 10. This structure reduces deformation or cracks on the electronic device mounting board 1 in the process of producing the electronic package 21 or the electronic module 31.

Method for Manufacturing Electronic Device Mounting Board and Electronic Package An example method for manufacturing the electronic device mounting board 1 and the electronic package 21 according to the present embodiment will now be described. The manufacturing method for the substrate 2 described below uses a multi-piece wiring substrate.

(1) A ceramic green sheet that is to be the substrate 2 is prepared first. To obtain the substrate 2 formed from, for example, sintered aluminum oxide ($Al_2O_3$) powders, such as silica ($SiO_2$), magnesia ($MgO$), or calcium oxide ($CaO$), are added as sintering aids to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The substrate 2 formed from, for example, a resin may be molded using a mold having a predetermined shape by transfer molding or injection molding, or by pressing using a die. The substrate 2 may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the substrate 2.

(2) A metal paste is then applied or placed, by screen printing or other techniques, to the areas to be the electrode pads 3, the electrodes for connection to external circuits, the inner wires, and the feedthrough conductors in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the bonding strength with the substrate 2.

When the substrate 2 is formed from a resin, the electrode pads 3, the electrodes for connection to external circuits, the inner wire conductors, and the feedthrough conductors can be prepared by, for example, sputtering or vapor deposition. In some embodiments, these components may be prepared by plating after forming a metal film on the surface.

(3) The green sheet is then processed using, for example, a die. In this process, an opening or a notch may be formed in a predetermined portion of the green sheet to be the substrate 2. Also, the first recess 5 and the second recess 6 may be formed at predetermined positions of the green sheet using a die or laser, or by punching.

In this process, the green sheet may be processed to form recesses, or holes and openings to be the first recess 5 and the second recess 6 on the substrate 2 using, for example, a die. In the process of forming the second recess 6, the green sheet may be processed to have an area to be the reinforcement 7 remaining using, for example, a die.

(4) Ceramic green sheets to be the insulating layers in the substrate 2 are then stacked and pressurized to prepare a ceramic green sheet laminate to be the substrate 2 (or the electronic device mounting board 1). This process may also include forming recesses (or openings) to be the first recess 5 and the second recess 6 at predetermined positions of the stacked ceramic green sheets using a die or laser, or by punching. In some embodiments, multiple ceramic green sheets with through-holes at positions to be the first recess 5 and the second recess 6 may be prepared and stacked on one another to form the first recess 5 and the second recess 6 defined by the multiple layers.

In this process, a laminate of ceramic green sheets to be the reinforcement 7 may be stacked onto the ceramic green sheet laminate to be the substrate 2 to form the reinforcement 7.

(5) The ceramic green sheet laminate is then fired at about 1,500 to 1,800° C. to obtain a multi-piece wiring substrate including an array of substrates 2 (electronic device mounting boards 1). In this process, the metal paste described above is fired together with the ceramic green sheet to be the substrate 2 (electronic device mounting board 1) to form the electrode pads 3, the electrodes for connection to external circuits, the inner wire conductors, and the feedthrough conductors.

(6) The multi-piece wiring substrate resulting from the firing process is then cut into multiple substrates 2 (electronic device mounting boards 1). In this cutting process, separation grooves may be formed along the outer edge of each of the substrates 2 (electronic device mounting boards 1), and the multi-piece wiring substrate may be split along the separation grooves into the multiple substrates 2 (electronic device mounting boards 1). In other embodiments, the multi-piece wiring substrate may be cut along the outer edge of each of the substrates 2 (electronic device mounting boards 1) by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by cutting the ceramic green sheet laminate to a depth smaller than its thickness with a slicer. Before or after the multi-piece wiring substrate is split into multiple substrates 2 (electronic device mounting boards 1), the electrode pads 3, the pads for external connection, and the uncovered wiring conductors may be plated by electroplating or electroless plating.

(7) The electronic device 10 is mounted on the first surface 2a of the electronic device mounting board 1, and the semiconductor device 11 is mounted on the second surface 2b of the electronic device mounting board 1. The electronic device 10 is electrically connected to the electronic device mounting board 1 with the first connection member 13 such as wire bonding. The electronic device 10 may be fixed onto the electronic device mounting board 1 with an adhesive or another bond applied to the electronic device 10 or to the electronic device mounting board 1. After the electronic device 10 is mounted on the electronic device mounting board 1, the lid 12 may be bonded to the electronic device mounting board 1 with the lid bond 14.

The electronic package 21 is obtained by fabricating the electronic device mounting board 1 and mounting the electronic device 10 on the electronic device mounting board 1 through the processes (1) to (7). The processes (1) to (7) may be performed in any order that enables intended processing.

Second Embodiment

Figure 8A:
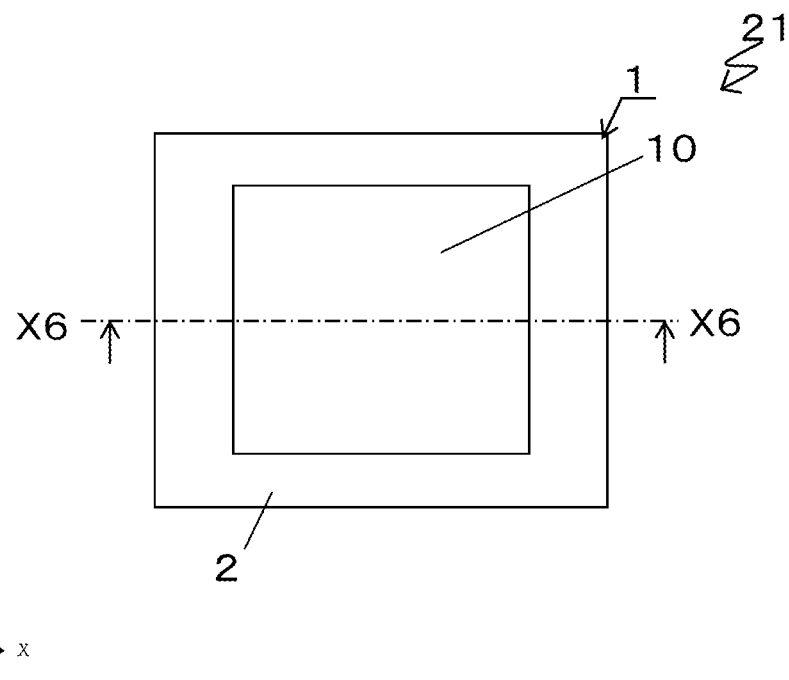
FIG. 8A is an external top view of an electronic device mounting board and an electronic package according to a second embodiment the present disclosure without showing a lid.
Figure 8B:
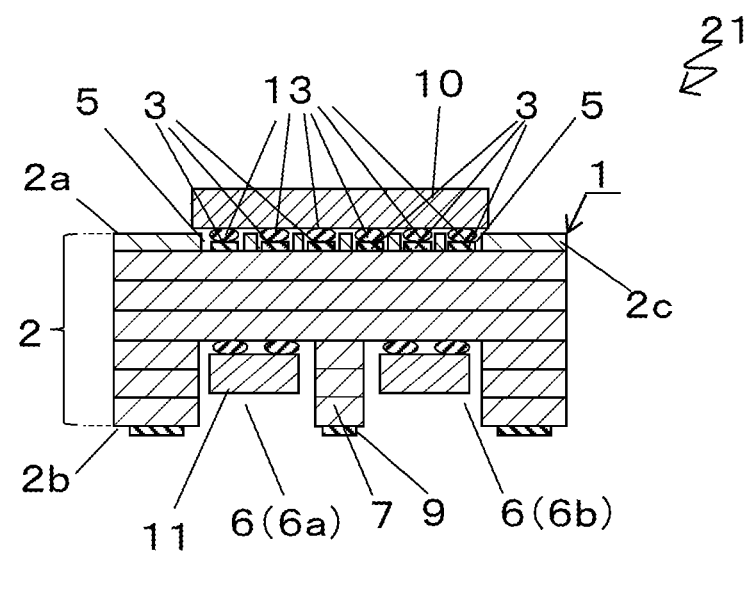
FIG. 8B is a cross-sectional view taken along line X6-X6 in FIG. 8A.

An electronic package 21 and an electronic device mounting board 1 according to a second embodiment of the present disclosure will now be described with reference to FIGS. 8A and 8B.

The electronic device mounting board 1 includes a substrate 2 having a first surface 2a and a second surface 2b opposite to the first surface 2a. The substrate 2 has a first recess 5 on the first surface 2a and a second recess 6 on the second surface 2b. The substrate 2 includes electrode pads 3. The electrode pads 3 are located in the first recess 5. The second recess 6 on the substrate 2 contains a reinforcement 7 that overlaps the electrode pads 3 in a plan view and divides the second recess 6 into a plurality of recesses.

The structures of an electronic module 31 and the electronic package 21, and the basic materials, conditions, and structures of the electronic device mounting board 1 including the substrate 2, the electrode pads 3, the first recess 5, the second recess 6, an electronic device 10, a semiconductor device 11, and other components in the present embodiment are similar to those described in the first embodiment, and will not be described. The features in the second embodiment will now be described.

In the electronic device mounting board 1 according to the present embodiment, the second recess 6 on the substrate 2 contains the reinforcement 7 that overlaps the electrode pads 3 in a plan view and divides the second recess 6 into a plurality of recesses.

The electronic device mounting boards have recently been thinner in response to a demand. The electronic device mounting boards having a recess for accommodating an electronic component or an electronic device may receive another electronic component on the surface opposite to the recess. The electronic component may be bonded to the electrode pads using a bonding member in a pressurizing process. The resultant pressure may cause deformation or cracks on the bottom surface of the recess (second recess) adjacent to an area overlapping the electrode pads in a plan view. Such deformation or cracks on the bottom surface of the recess may cause defective mounting or disable mounting in the process of mounting the electronic device or the electronic component.

In the present embodiment, the second recess 6 contains the reinforcement 7 at the position overlapping the electrode pads 3 in a plan view. The reinforcement 7 divides the second recess 6 into a plurality of recesses, and thus reduces deformation of the bottom surface of the second recess 6. This structure thus reduces cracks. This structure lowers the likelihood of mounting being either defective or disabled in the process of mounting the electronic device or the electronic component.

The electronic device mounting board 1 may have the first recess 5 smaller than the second recess 6 in a plan view. This structure reduces an area overlapping between the first recess 5 on the first surface 2a and the second recess 6 on the second surface 2b as viewed from above. This structure thus reduces cracks or breaks in the substrate 2 under pressure applied in the process of bonding the first connection member 13 (described later) or the electronic component to the electrode pads 3 located in the first recess 5.

The electronic device mounting board 1 may have multiple first recesses 5. The multiple first recesses 5 can accommodate the electrode pads 3 for connection to the electronic device 10 and/or to the electronic component at multiple different positions. This structure produces the advantageous effects of the present embodiment and allows the electronic device 10 to have more terminals, achieving high functionality. This structure also increases areas on which the electronic component is mountable. The electronic package 21 can thus have high functionality.

The first recess 5 may be less deep than the second recess 6. In this case as well, the first recess 5 deep enough to accommodate the electrode pads 3 as described above produces the advantageous effects of the present embodiment. The electrode pads 3 having the upper surfaces located lower than the upper end of the first recess 5 (toward the lower surface or the second surface) are less likely to be damaged.

Method for Manufacturing Electronic Device Mounting Board and Electronic Package An example method for manufacturing the electronic device mounting board 1 and the electronic package 21 according to the present embodiment will now be described. The method for manufacturing the electronic device mounting board 1 and the electronic package 21 according to the present embodiment is basically similar to the manufacturing method described in the first embodiment. The method for manufacturing the electronic device mounting board 1 according to the present embodiment includes forming the reinforcement 7 at a predetermined position adjacent to the area in which the second recess 6 overlaps the electrode pads 3 in the process of forming the second recess 6.

Third Embodiment

Figure 9A:
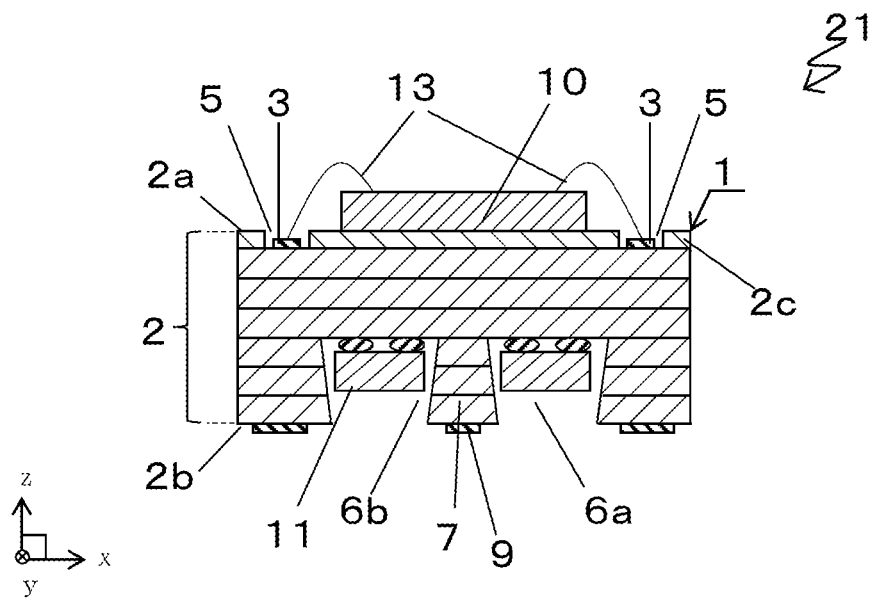
FIG. 9A is a cross-sectional view of an electronic device mounting board and an electronic package according to a third embodiment of the present disclosure without showing a lid.
Figure 9B:
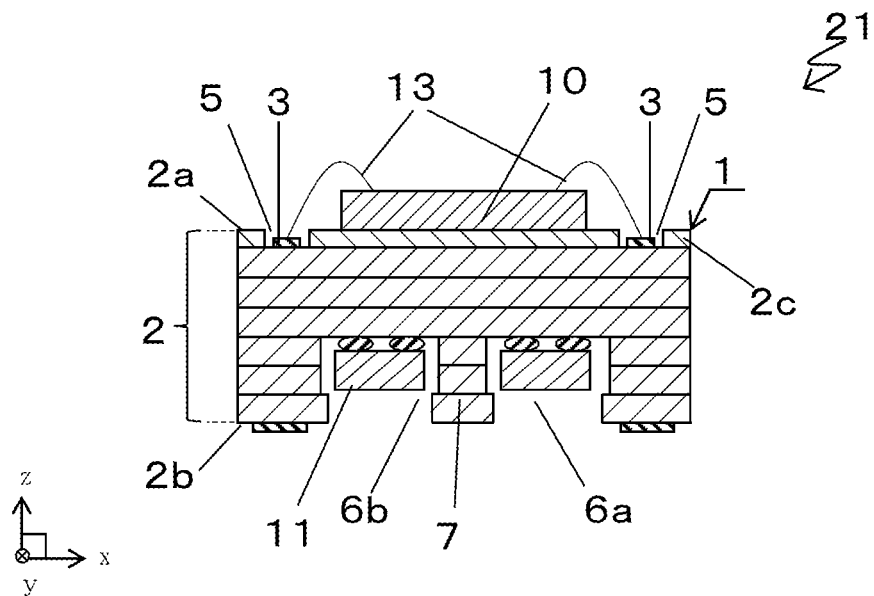
FIG. 9B is a cross-sectional view of an electronic device mounting board and an electronic package according to a modification of the third embodiment of the present disclosure without showing a lid.

An electronic device mounting board 1 according to a third embodiment of the present disclosure will now be described with reference to FIGS. 9A and 9B. FIGS. 9A and 9B show an electronic package 21 according to the present embodiment without showing a lid 12.

The electronic device mounting board 1 according to the present embodiment differs from the electronic device mounting board 1 in a third recess 6a and/or a fourth recess 6b having an opening wider either partly or gradually away from a second surface 2b.

The electronic device mounting board 1 in the example shown in FIG. 9A has the third recess 6a and/or the fourth recess 6b with an opening wider away from the second surface 2b. In other words, the third recess 6a and/or the fourth recess 6b have an opening gradually narrower from the bottom surface toward downward. In the present embodiment as well, the second recess 6 contains a reinforcement 7 that divides a second recess 6 into a plurality of recesses. The reinforcement 7 thus reduces deformation of the bottom surface of the second recess 6. This structure lowers the likelihood of mounting being either defective or disabled in the process of mounting the electronic device or the electronic component.

The electronic device mounting board 1 in the example shown in FIG. 9B has the third recess 6a and/or the fourth recess 6b having an opening partly wider in a portion away from the second surface 2b. In other words, the third recess 6a and/or the fourth recess 6b have an opening narrower away from the bottom surface. In the present embodiment as well, the second recess 6 contains the reinforcement 7 that divides the second recess 6 into a plurality of recesses. The reinforcement 7 thus reduces deformation of the bottom surface of the second recess 6. This structure lowers the likelihood of mounting being either defective or disabled in the process of mounting the electronic device or the electronic component.

In the examples shown in FIGS. 9A and 9B, the reinforcement 7 includes a portion (lower end) in contact with a fixture or another tool larger than a portion (upper end) in contact with the substrate 2. The reinforcement 7 thus has a larger contact area with the fixture, reinforcing the substrate 2 (the bottom surface of the second recess 6) in a more stable manner. This structure reduces deformation of the bottom surface of the second recess 6. This structure lowers the likelihood of mounting being either defective or disabled in the process of mounting the electronic device or the electronic component.

As shown in FIGS. 9A and 9B, the third recess 6a and/or the fourth recess 6b have an opening wider away from the second surface 2b. The structures reduce an overflow of a sealant from the third recess 6a and/or the fourth recess 6b when, for example, the recess accommodating the semiconductor device 11 is sealed with the sealant.

To prepare the substrate 2 having the reinforcement 7 as shown in FIGS. 9A and 9B, the ceramic green sheets having openings with different sizes obtained through a punching process may be stacked in the process performed according to the manufacturing method according to the first embodiment.

Fourth Embodiment

Figure 10A:
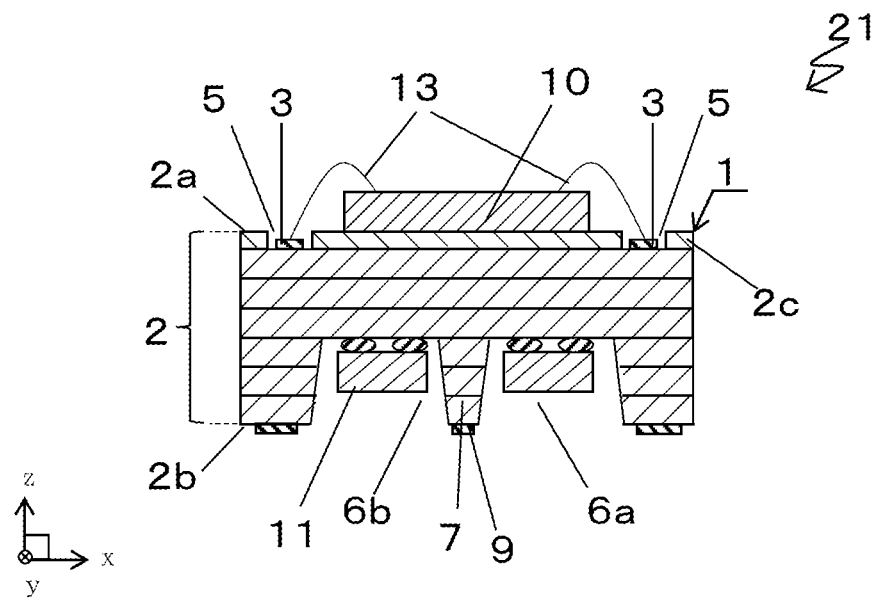
FIG. 10A is a cross-sectional view of an electronic device mounting board and an electronic package according to a fourth embodiment of the present disclosure without showing a lid.
Figure 10B:
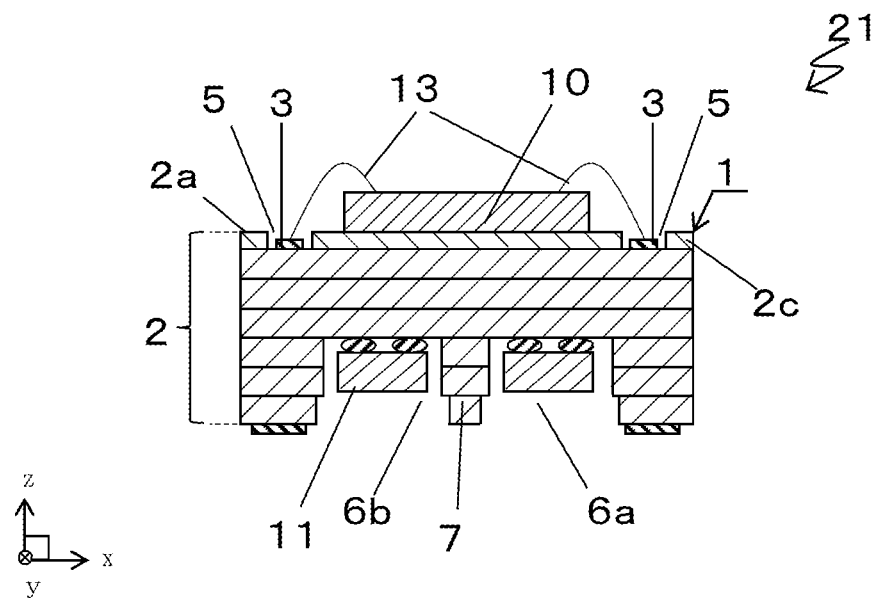
FIG. 10B is a cross-sectional view of an electronic device mounting board and an electronic package according to a modification of the fourth embodiment of the present disclosure without showing a lid.

An electronic device mounting board 1 according to a fourth embodiment of the present disclosure will now be described with reference to FIGS. 10A and 10B. FIGS. 10A and 10B show an electronic package 21 according to the present embodiment without showing a lid 12.

The electronic device mounting board 1 according to the present embodiment differs from the electronic device mounting board 1 according to the first embodiment in a third recess 6a and/or a fourth recess 6b having an opening narrower partly or gradually away from a second surface 2b.

The electronic device mounting board 1 in the example shown in FIG. 10A has the third recess 6a and/or the fourth recess 6b with an opening narrower away from the second surface 2b. In other words, the third recess 6a and/or the fourth recess 6b have an opening gradually wider from the bottom surface toward downward. In the present embodiment as well, a second recess 6 contains a reinforcement 7 that divides the second recess 6 into a plurality of recesses. The reinforcement 7 thus reduces deformation of the bottom surface of the second recess 6. This structure lowers the likelihood of mounting being either defective or disabled in the process of mounting the electronic device or the electronic component.

The electronic device mounting board 1 in the example shown in FIG. 10B has the third recess 6a and/or the fourth recess 6b having an opening narrower away from the second surface 2b. In other words, the third recess 6a and/or the fourth recess 6b have an opening, extending from the bottom surface toward downward, having a wider portion defined by the lowermost surface (second surface 2b) than other portions. In the present embodiment as well, a second recess 6 contains a reinforcement 7 that divides the second recess 6 into a plurality of recesses. The reinforcement 7 thus reduces deformation of the bottom surface of the second recess 6. This structure lowers the likelihood of mounting being either defective or disabled in the process of mounting the electronic device or the electronic component.

In the examples shown in FIGS. 10A and 10B, the third recess 6a and/or the fourth recess 6b that are wider at the opening than at the bottom surface. The structures reduce defects such as a semiconductor device 11 misaligned at the mounting position or dropped when the transport equipment transporting the semiconductor device 11 comes in contact with, at its distal end, a side wall of the third recess 6a and/or the fourth recess 6b in the mounting or other processes associated with the semiconductor device 11. This improves the yield of the electronic package 21, and reduces the process load.

As shown in FIG. 10B, the third recess 6a and/or the fourth recess 6b have a larger opening in the lowermost insulating layer than in other layers. For example, when the substrate 2 is formed from an electrical insulating ceramic material, this structure lowers the likelihood of the opening of the third recess 6a and/or the fourth recess 6b becoming smaller than a design value due to misalignment in stacking from process errors in the process of pressurizing and stacking layers. This structure lowers the likelihood of mounting of the semiconductor device 11 being disabled, and improves the yield of the electronic package 21, thus reducing the process load.

To prepare the substrate 2 having the reinforcement 7 as shown in FIGS. 10A and 10B, the ceramic green sheets having openings with different sizes obtained through a punching process may be stacked, in addition to the manufacturing method according to the first embodiment.

Fifth Embodiment

Figure 11:
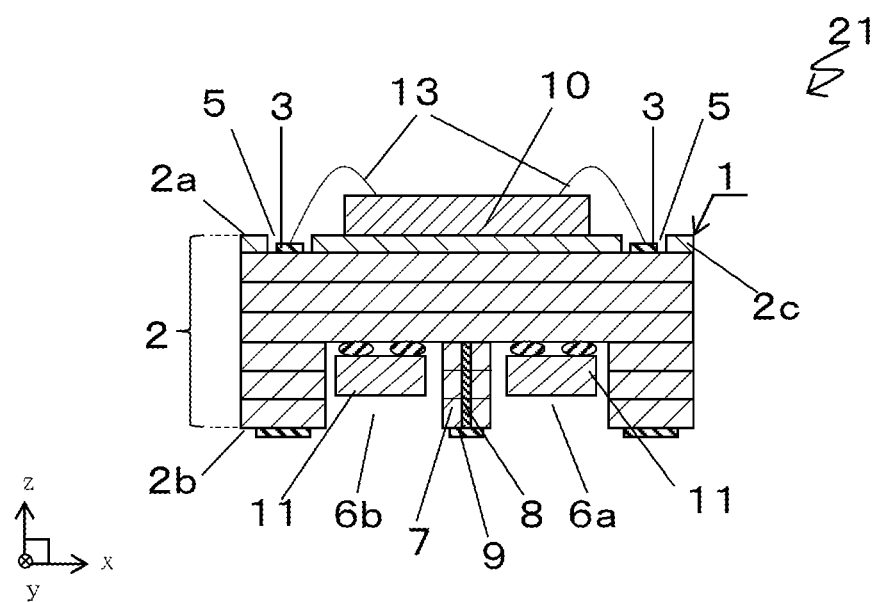
FIG. 11 is a cross-sectional view of an electronic device mounting board and an electronic package according to a fifth embodiment of the present disclosure without showing a lid.

An electronic device mounting board 1 according to a fifth embodiment of the present disclosure will now be described with reference to FIG. 11. FIG. 11 shows an electronic package 21 according to the present embodiment without showing a lid 12.

The electronic device mounting board 1 according to the present embodiment differs from the electronic device mounting board 1 according to the first embodiment in that a reinforcement 7 internally includes a via conductor 8, and includes a metal layer 9 on its surface.

The electronic device mounting board 1 shown in FIG. 11 includes the reinforcement 7 internally including the via conductor 8. In the present embodiment as well, the reinforcement 7 reduces deformation of the bottom surface of a second recess 6, thus producing the advantageous effects of the embodiments of the present disclosure.

Further, for example, the via conductor 8 may be electrically connected to a ground potential. The reinforcement 7 including the internal via conductor 8 electrically connected to the ground potential functions as a shield. This structure thus reduces electromagnetic interference between semiconductor devices 11 each mounted in the third recess 6a and the fourth recess 6b. This structure may include multiple via conductors 8 to enhance the advantageous effects further.

The reinforcement 7 in the electronic device mounting board 1 shown in FIG. 11 includes a metal layer 9 on its surface. In the present embodiment as well, the reinforcement 7 reduces deformation of the bottom surface of a second recess 6, thus producing the advantageous effects of the embodiments of the present disclosure.

The reinforcement 7 including the metal layer 9 on its surface may have the metal layer 9 connected to an external circuit board with, for example, solder, a brazing material, or a resin. To achieve high functionality, the semiconductor device 11 is to be larger or multiple semiconductor devices 11 are to be mounted. However, the second recess 6 (a third recess 6a and a fourth recess 6b) to be larger in response to a demand can reduce the area for connection between the electronic device mounting board 1 and the external circuit board, and thus lowers the bonding strength. In the present embodiment, the reinforcement 7 including, on its surface, the metal layer 9 that can be joined to, for example, an external circuit board may improve the bonding strength between the external circuit board and the electronic device mounting board 1.

The via conductor 8 internally included in the reinforcement 7 may be electrically connected to the metal layer 9. When the via conductor 8 is electrically connected to, for example, the ground potential and to the metal layer 9, the via conductor 8 may be electrically connected to a ground potential of the external circuit board through the metal layer 9. This structure aids the ground potential of the electronic device mounting board 1, and further reduces electromagnetic interference between the semiconductor devices 11 each mounted in the third recess 6a and the fourth recess 6b. This structure thus improves the electrical characteristics of the electronic package 21.

The metal layer 9 may have substantially the same thickness as, for example, an external terminal on the second surface 2b of the substrate 2. The metal layer 9 may thus be connected to an external circuit board with, for example, solder, similarly to the external terminal, to have the same thickness as solder or other connection used for the external terminal. This reduces the process load for applying, for example, solder. The metal layer 9 may be thicker than the external terminal on the second surface 2b of the substrate 2. In this structure, the metal layer 9 may have a thickness equivalent to the total thickness of the external terminal and the solder or other connection to the external terminal. This structure lowers the likelihood that a gap between the reinforcement 7 and the external circuit board causes deformation in the second recess 6 under external stress when the metal layer 9 is not joined to the external circuit board.

Sixth Embodiment

Figure 12:
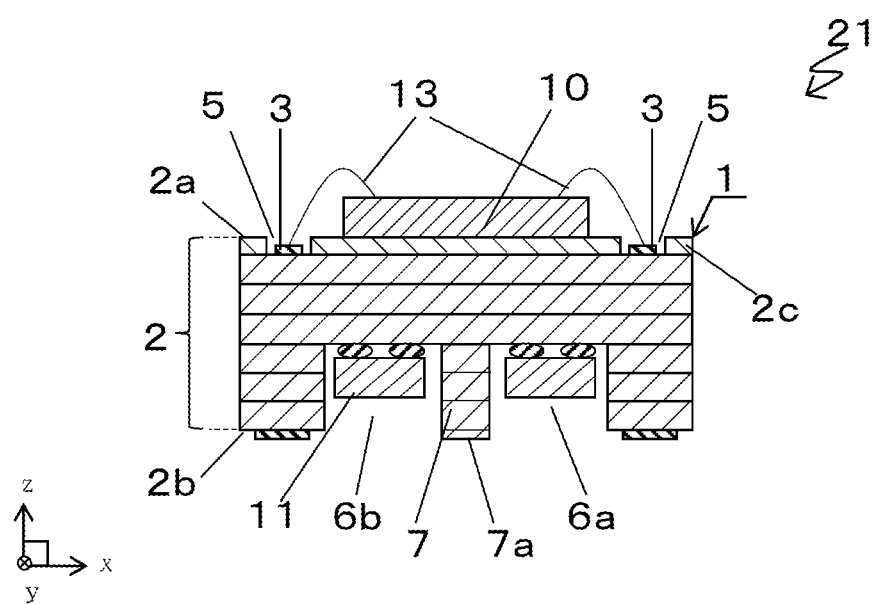
FIG. 12 is a cross-sectional view of an electronic device mounting board and an electronic package according to a sixth embodiment of the present disclosure without showing a lid.

An electronic device mounting board 1 according to a sixth embodiment of the present disclosure will now be described with reference to FIG. 12. FIG. 12 shows an electronic package 21 according to the present embodiment without showing a lid 12.

The electronic device mounting board 1 according to the present embodiment differs from the electronic device mounting board 1 according to the first embodiment in that a reinforcement 7 includes a ceramic coating 7a on its surface.

The electronic device mounting board 1 shown in FIG. 12 is formed from an electrical insulating ceramic material, and includes the reinforcement 7 including the ceramic coating 7a on its surface. In the present embodiment as well, the reinforcement 7 reduces deformation of the bottom surface of a second recess 6, thus producing the advantageous effects of the embodiments of the present disclosure.

The reinforcement 7 including the ceramic coating 7a on its surface may have the ceramic coating 7a connected to an external circuit board with, for example, a resin. To achieve high functionality, a semiconductor device 11 is to be larger or multiple semiconductor devices 11 are to be mounted. However, the second recess 6 (a third recess 6a and a fourth recess 6b) to be larger in response to a demand can reduce the area for connection between the electronic device mounting board 1 and the external circuit board, and thus lowers the bonding strength. In the present embodiment, the reinforcement 7 including, on its surface, the ceramic coating 7a that can be joined to, for example, an external circuit board may improve the bonding strength between the external circuit board and the electronic device mounting board 1. The ceramic coating 7a is porous and can trap solder. This makes it less likely that solder moves along the reinforcement 7 and adheres to the semiconductor device 11, thus unexpected short-circuiting causes.

The ceramic coating 7a may have substantially the same thickness as an external terminal arranged on the second surface 2b of the substrate 2. The ceramic coating 7a may thus be connected to an external circuit board with, for example, solder, similarly to the external terminal, to have the same thickness as solder or other connection used for the external terminal. This reduces the process load for applying, for example, solder. The ceramic coating 7a may be thicker than the external terminal on the second surface 2b of the substrate 2. In this structure, the ceramic coating 7a may have a thickness equivalent to the total thickness of the external terminal and the solder or other connection to the external terminal. This structure lowers the likelihood that a gap between the reinforcement 7 and the external circuit board causes deformation in the second recess 6 under external stress when the ceramic coating 7a is not joined to the external circuit board.

The present disclosure is not limited to the examples described in the above embodiments, and may be variously modified, including numerical values. For example, although the electrode pads 3 are rectangular as viewed from above in the examples shown in the figures, they may be circular or polygonal. In the present embodiments, any number of electrodes 3 with any shapes may be used in any arrangement, and the electronic device may be mounted with any method. The characteristic features according to the present embodiments may be variously combined, without being limited to the examples described in the above embodiments. For example, the recess may not be quadrangular, and have rounded corners.

REFERENCE SIGNS LIST 1 electronic device mounting board
2 substrate
2a first surface
2b second surface
2c insulating layer
3 electrode pad
5 first recess
6 second recess
6a third recess
6b fourth recess
7 reinforcement
7a ceramic coating
8 via conductor
9 metal layer
10 electronic device
11 semiconductor device
12 lid
13 first connection member
14 lid bond
15 second connection member
21 electronic package
23 electronic component
31 electronic module
32 housing

What is claimed is:

1. An electronic device mounting board, comprising:
   a substrate having a first surface and a second surface opposite to the first surface;
   a first recess located on the first surface;
   a second recess located on the second surface; and
   an electrode pad located in the first recess,
   wherein the second recess contains a reinforcement dividing the second recess into a plurality of recesses, and
   the reinforcement is located separate from the electrode pad or is located to overlap the electrode pad in a plan view.

2. The electronic device mounting board according to claim 1, wherein
   the second recess includes a third recess and a fourth recess that are adjacent to each other with the reinforcement in between.

3. The electronic device mounting board according to claim 2, wherein
   the third recess and the fourth recess have the same size in a plan view.

4. The electronic device mounting board according to claim 2, wherein
   at least one of the third recess or the fourth recess has an opening narrower from the first surface toward the second surface.

5. The electronic device mounting board according to claim 2, wherein
   at least one of the third recess or the fourth recess has an opening wider from the first surface toward the second surface.

6. The electronic device mounting board according to claim 1, wherein
   the reinforcement internally includes a via conductor.

7. The electronic device mounting board according to claim 1, wherein
   the reinforcement has a metal layer on a surface of the reinforcement.

8. The electronic device mounting board according to claim 1, wherein
   the first recess is smaller than the second recess in a plan view.

9. The electronic device mounting board according to claim 1, wherein
   the first recess is one of a plurality of first recesses located on the first surface.

10. The electronic device mounting board according to claim 1, wherein
    the substrate comprises a ceramic material, and
    the first recess has a side wall including a ceramic coating.

11. The electronic device mounting board according to claim 1, wherein
    the first recess is less deep than the second recess.

12. The electronic device mounting board according to claim 1, wherein
    the first recess is tapered in a cross-sectional view.

13. The electronic device mounting board according to claim 1, wherein
    the first recess is stepped in a cross-sectional view.

14. An electronic package, comprising:
    the electronic device mounting board according to claim 1; and
    an electronic device mounted on the electronic device mounting board.

15. An electronic module, comprising:
    the electronic package according to claim 14; and
    a housing located above the electronic package.

* * * * *